Figure 1:
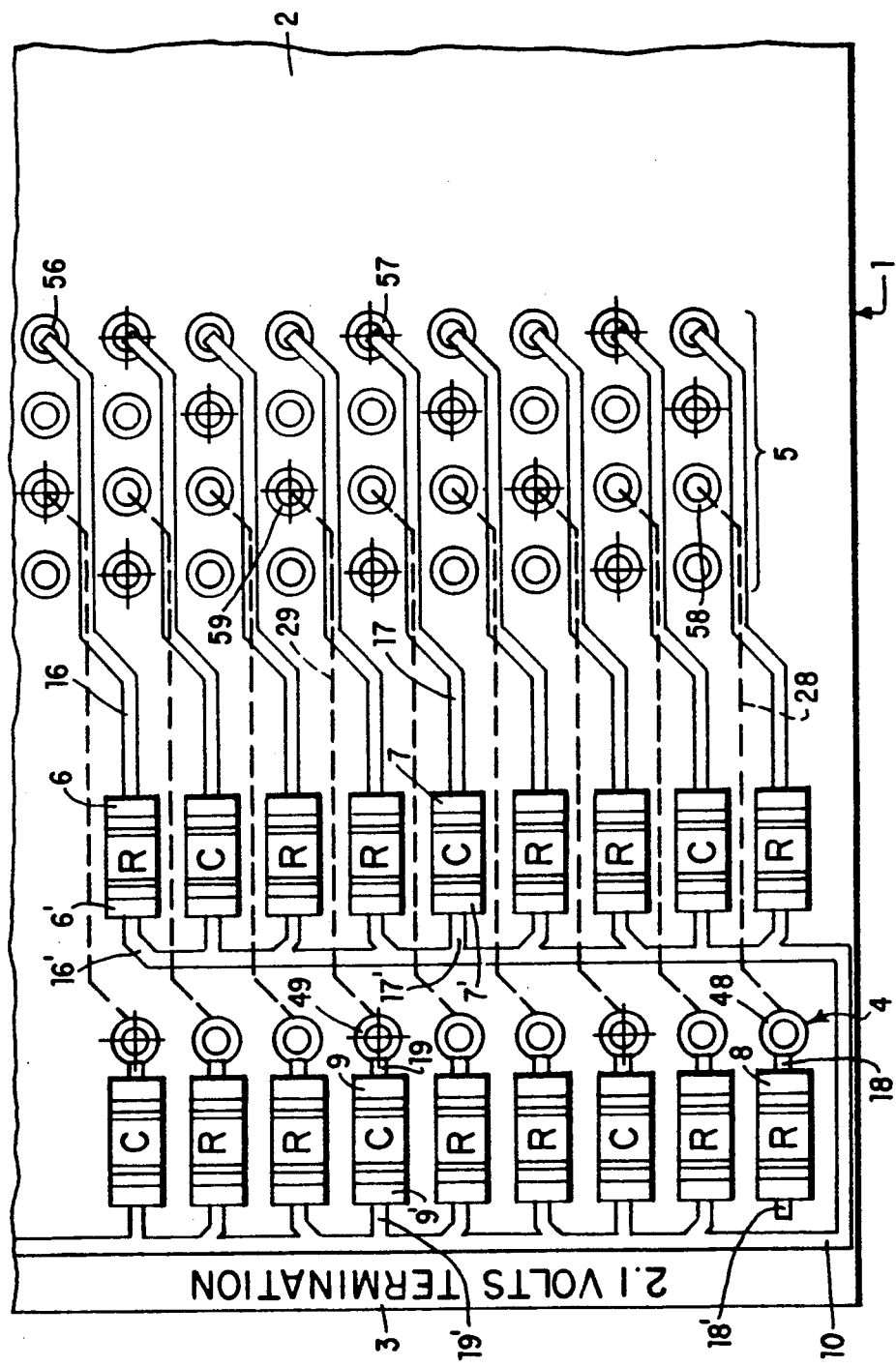

United States Patent [19]

Lawrence

[11] Patent Number: 5,128,832
[45] Date of Patent: Jul. 7, 1992

[54] TERMINATION OF THE SIGNAL AND GROUND LINES OF A BACKPLANE

[75] Inventor: Howard Lawrence, Southampton, England

[73] Assignee: BICC plc, London, England

[21] Appl. No.: 603,219

[22] Filed: Oct. 25, 1990

[30] Foreign Application Priority Data

Oct. 27, 1989 [GB] United Kingdom ............... 8924282

[51] Int. Cl.[5] .................................. H02B 1/02
[52] U.S. Cl. ...................... 361/407; 361/414; 361/415; 439/65
[58] Field of Search .............. 361/400, 407, 414, 415; 338/260, 320; 174/255, 257; 439/65, 59, 76

[56] References Cited

U.S. PATENT DOCUMENTS

| | | | |
|---|---|---|---|
| 4,054,939 | 10/1977 | Ammon | 361/414 |
| 4,626,804 | 12/1986 | Risher et al. | 338/260 |
| 4,694,123 | 9/1987 | Massey | 361/414 X |

FOREIGN PATENT DOCUMENTS 2060266A 4/1981 United Kingdom .
2139007A 10/1984 United Kingdom .

Primary Examiner—Leo P. Picard
Assistant Examiner—Paramita Ghosh
Attorney, Agent, or Firm—Oliff & Berridge

[57] ABSTRACT

In a "Futurebus+" backplane, at each end of the backplane the signal lines are each electrically connected to a power bus on a face of the board or to a power plane encapsulated in the board via a discrete resistor mounted on the face of the board and separately formed with respect to the other resistors and the ground lines are each electrically connected to the power bus or power plane via a discrete capacitor mounted on the face of the board and separately formed with respect to the other capacitors. Preferably, at each end of the backplane the discrete resistors and capacitors are mounted on both faces of the board, the number on one face being approximately the same as the number on the other face. In the event that a resistor or capacitor should be faulty, only the signal or ground line to which the faulty resistor or capacitor is connected will be out of service until the faulty resistor or capacitor is replaced.

12 Claims, 3 Drawing Sheets

TERMINATION OF THE SIGNAL AND GROUND LINES OF A BACKPLANE

In complex electronic apparatus incorporating a plurality of circuit boards arranged with their major faces lying in substantially parallel planes, it is the general practice to interconnect circuits of such boards by means of multi-circuits and associated connectors carried on a board, frequently referred to as a mother board or backplane, to which edge connectors of said plurality of circuit boards are permanently or detachably connected.

One kind of mother board or backplane which has hitherto been proposed and used comprises a substantially rigid board of electrically insulating material having extending through the board a multiplicity of holes whose boundary walls are coated with a layer of electrically conductive metal or metal alloy (such metal coated holes generally and hereinafter being referred to as plated through holes) and which are arranged in a plurality of discrete groups of plated through holes mutually spaced transversely of the board, the plated through holes of each group being arranged in a pattern of columns and rows of mutually spaced holes, the pitch between adjacent plated through holes of each column and of each row being n. Each of a major proportion of the plated through holes of each group is electrically connected in series to the correspondingly positioned plated through hole in each of the other groups by an elongate track of electrically conductive metal or metal alloy encapsulated in the electrically insulating material of the rigid board to form a signal line, the tracks electrically connected to the plated through holes of corresponding columns of the groups lying in common planes which are substantially parallel to and mutually spaced from one another and being electrically insulated from one another by the electrically insulating material of the board. Each of the remaining minor proportion of the plated through holes of each group is electrically connected to a substantially continuous layer of electrically conductive metal or metal alloy which is encapsulated in the electrically insulating material of the board and which constitutes a ground plane, to form a ground line. A mother board or backplane of the aforesaid kind will hereinafter, for convenience, be referred to as "a backplane of the kind described". A backplane of the kind described may carry also a power bus or a number of power buses; the or a power bus may be an area of electrically conductive metal or metal alloy on a major surface of the rigid board and/or the or a power bus may be a substantially continuous layer of electrically conductive metal or metal alloy constituting a power plane encapsulated in the electrically insulating material of the board and spaced and electrically insulated from the or each ground plane or from an adjacent power plane.

When a backplane of the kind described is to be used, at each end of the backplane the signal lines are electrically connected to a power bus remote from the backplane or to the or a power bus or power plane constituting a component part of the backplane through resistors and the ground lines are electrically connected to said power bus or power plane through capacitors.

In one backplane of the kind described which is currently widely used and which is generally known as the "Futurebus" backplane, each group of plated through holes comprises three columns each of 32 mutually spaced holes, the pitch n between adjacent holes in each column and in each row being 2.54 mm. At each end of a "Futurebus" backplane, each signal line is terminated by a terminator assembly which carries a multi-socket connector for engaging with pins which have been electrically connected in the plated through holes of the end group of holes and which protrude from the rear of the board. A major proportion of the signal line sockets of the multi-socket connector carried by each terminator assembly are electrically connected via resistor packs mounted on the terminator assembly to the or a power bus remote from the board and the remaining minor proportion of ground line sockets—which are substantially evenly distributed in the multi-socket connector—are electrically connected to this power bus via capacitor packs mounted on the terminator assembly; each resistor pack is electrically connected to a plurality of signal lines, usually nine, and each capacitor pack is electrically connected to a plurality of ground lines, usually between ten and fourteen. Whilst the "Futurebus" backplane and the terminator assemblies used with the "Futurebus" backplane have been found to be suitable for accommodating the bit rate of the digital signals transmitted by electronic apparatus currently in use, it has been found that they cannot accommodate the high bit rate of the digital signals transmitted by the more complex electronic apparatus now employed, with the result that the transmitted digital signals are inevitably delayed, attenuated or distorted. Moreover, it has been found that the sockets of the multi-socket connectors of the terminator assemblies used with the "Futurebus" backplane are so arranged relative to one another that, when the transmitted digital signals have a high bit rate, there is invariably unacceptable interference, i.e. cross talk, between transmitted digital signals carried by separate signal lines of the board.

With a view to providing a backplane of the kind described which will have greater flexibility and enhanced performance, a backplane of the kind described has been proposed—known as the "Futurebus+" backplane—in which each group of plated through holes to which an edge connector of a circuit board can be electrically connected consists of four columns of 48 holes, the pitch n between adjacent holes in each column and in each row being 2 mm. For the first time, at each end of each group additional plated through holes are provided for reception of a separate power connector. A signal connector to be connected to the 192 plated through holes of each group may comprise discrete modules of, say, $4 \times 6$ pins which can be assembled end to end to form a 192 pin connector which will be connected to the front face of the board and with which a female edge connector of a circuit board can readily engage. Alternatively, the signal connector may comprise a single module of $4 \times 48$ pins. The pins of each module assembled to form the pin connector protrude a very short distance from the rear face of the board and may be soldered in place. As a consequence, the terminator assemblies currently employed to terminate a "Futurebus" backplane are not suitable for terminating the Futurebus+ backplane and a terminating arrangement for terminating a "Futurebus+" backplane is required which in no way will inhibit use being made of the greater flexibility and enhanced performance of the "Futurebus+" backplane.

It is an object of the present invention to provide a backplane of the kind described which incorporates an improved arrangement for terminating the signal and ground lines of the backplane.

In the improved backplane of the kind described according to the invention, at each end of the backplane the signal lines are each electrically connected to the or a power bus on a face of the board or to the or a power plane encapsulated in the board via a resistor which is mounted on the face of the board and which is separately formed with respect to the resistors electrically connected to the other signal lines and the ground lines are each electrically connected to said power bus or power plane via a capacitor which is mounted on a face of the board and which is separately formed with respect to the capacitors electrically connected to the other ground lines.

By virtue of the fact that each signal line at each of its ends is connected to a discrete resistor and each ground line at each of its ends is connected to a discrete capacitor, in the event that a resistor or capacitor should be faulty only the signal or ground line to which the faulty resistor or capacitor is connected will be out of service until the faulty resistor or capacitor is replaced. This is an important advantage not provided by the terminator assemblies of the "Futurebus" backplane.

Preferably, at each end of the backplane the discrete resistors and capacitors are mounted on both faces of the board and, in a preferred embodiment, the number of resistors and capacitors mounted on one face is approximately the same as the number of resistors and capacitors mounted on the other face.

At each end of the board, the discrete resistors and capacitors may be mounted on each face of the board in a marginal portion of the board between the end edge of the board and the nearest group of plated through holes in two columns of mutually spaced discrete resistors and capacitors. In this arrangement, one terminal of each resistor may be electrically connected to a plated through hole of said nearest group of holes interconnected in a signal line by a track of electrically conductive metal or metal alloy and the other terminal of each resistor may be electrically connected to a power bus constituted by an area of electrically conductive metal or metal alloy on the face of the board by a track of electrically conductive metal or metal alloy on the face of the board, and one terminal of each capacitor may be electrically connected to a plated through hole of said nearest group of holes interconnected in a ground line by a track of electrically conductive metal or metal alloy and the other terminal of each capacitor may be electrically connected to said power bus by a track of electrically conductive metal or metal alloy on the face of the board. Each track electrically connected to a terminal of a resistor or capacitor in a column can be made to be of the same length and shape as those of the tracks electrically connected to the corresponding terminals of the other resistors or capacitors in the same column, but the tracks electrically connected to the terminals of resistors or capacitors in one column will be of a length and shape differing from those of the tracks electrically connected to corresponding terminals of resistors or capacitors in the other column. Thus, although in this arrangement the cross-talk and degree of slew arising from tracks of lengths and shapes differing from one another will be reduced as compared with terminating arrangements of backplanes of the kind described hitherto proposed and used, where the bit rate is expected to be high, a modified arrangement is preferred.

In this preferred modified arrangement, at each end of and on each face of the board, one column of mutually spaced discrete resistors and capacitors and a power bus constituted by an area of metal or metal alloy on the face of the board are positioned in a marginal portion of the board between the end edge of the board and the nearest group of plated through holes and a second column of mutually spaced discrete resistors and capacitors and a second power bus constituted by an area of metal or metal alloy on the face of the board are positioned between said nearest group of plated through holes and the adjacent group of plated through holes, each column of resistors and capacitors being spaced a like distance from said nearest group of plated through holes and a like distance from its associated power bus, and one terminal of each resistor of the first column is electrically connected to a plated through hole of said nearest group of holes interconnected in a signal line by a track of electrically conductive metal or metal alloy on the face of the board and the other terminal of each resistor of said first column is electrically connected to said power bus associated with said first column by a track of electrically conductive metal or metal alloy on the face of the board, and the terminal of each capacitor of said first column is electrically connected to a plated through hole of said nearest group of holes interconnected in a ground line by a track of electrically conductive metal or metal alloy on the face of the board and the other terminal of each capacitor of said first column is electrically connected to said associated power bus by a track of electrically conductive metal or metal alloy on the face of the board, and one terminal of each resistor of the second column is electrically connected to a plated through hole of said nearest group of holes interconnected in a signal line by a track of electrically conductive metal or metal alloy on the face of the board and the other terminal of each resistor of said second column is electrically connected to said power bus associated with said second column by a track of electrically conductive metal or metal alloy on the face of the board, and one terminal of each capacitor of said second column is electrically connected to a plated through hole of said nearest group of holes interconnected in a ground line by a track of electrically conductive metal or metal alloy on the face of the board and the other terminal of each capacitor of said second column is electrically connected to said power bus associated with said second column by a track of electrically conductive metal or metal alloy on the face of the board. In this alternative arrangement the tracks electrically connected to corresponding terminals of the resistors and capacitors of both columns can be arranged to be of substantially the same length and shape as one another, thereby substantially eliminating any risk of slew.

In an alternative form of the preferred modified arrangement in which the number of tracks of electrically conductive metal or metal alloy on each face of the board is reduced, at each end of the backplane one terminal of each resistor of each column is electrically connected to a plated through hole of said nearest group of holes interconnected in a signal line and the other terminal of each resistor of each column is electrically connected to a plated through hole in electrical contact with a substantially continuous layer of electrically conductive metal or metal alloy encapsulated in the electrically insulating material of the board and constituting a power plane, and one terminal of each capacitor of each column is electrically connected to a plated through hole interconnected in a ground line and the other terminal of each capacitor of each column is electrically connected to a plated through hole in electrical contact with said power plane. In this alternative terminating arrangement, risk of cross-talk and slew is negligible.

In all cases, to reduce risk of cross-talk further, preferably between discrete resistors and capacitors on one or each face of the board guard tracks of electrically conductive metal or metal alloy are disposed and are electrically connected to a ground line.

Each discrete resistor and each discrete capacitor preferably is of conventional form and includes at each of its ends a lead which can be readily soldered to a track or power bus on a face of the board or can be readily soldered in a plated through hole in electrical contact with an encapsulated power plane or ground plane. Where it is desired that the leads of the discrete resistors and capacitors are to be soldered into plated through holes in electrical contact with encapsulated power and ground planes these holes may be arranged in a number of columns, the spacing between the holes in each column and the spacing between the holes in each row being that which is necessary to accommodate the resistors and capacitors and their leads on a face of the board.

The improved backplane terminating arrangement of the present invention is especially, but not exclusively, suitable for use with a "Futurebus+" backplane and, in this case, the bus will use recently developed, high-current, open collector Backplane Transceiver Logic (BTL) on all signals.

Figure 2:
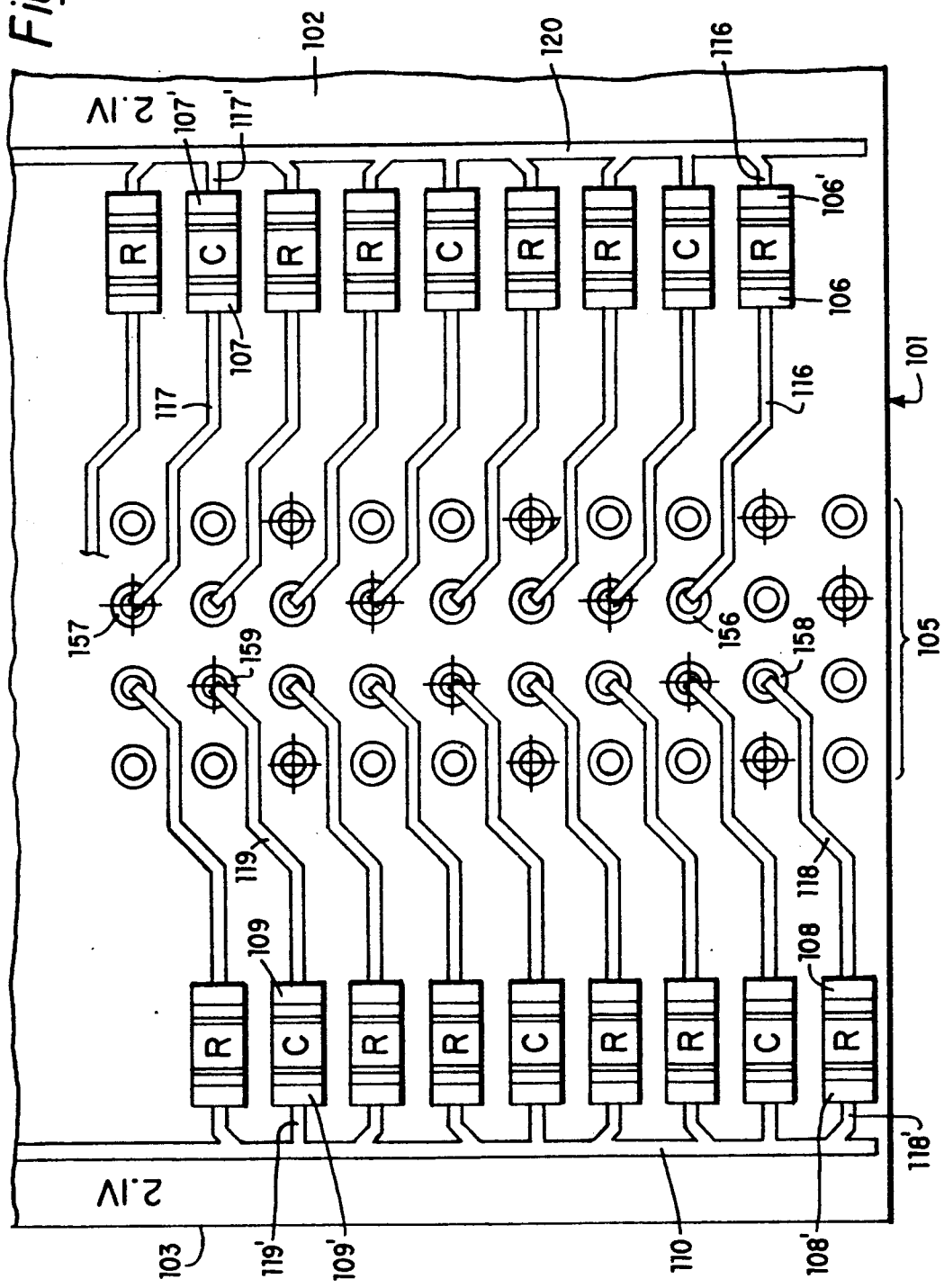
Figure 3:
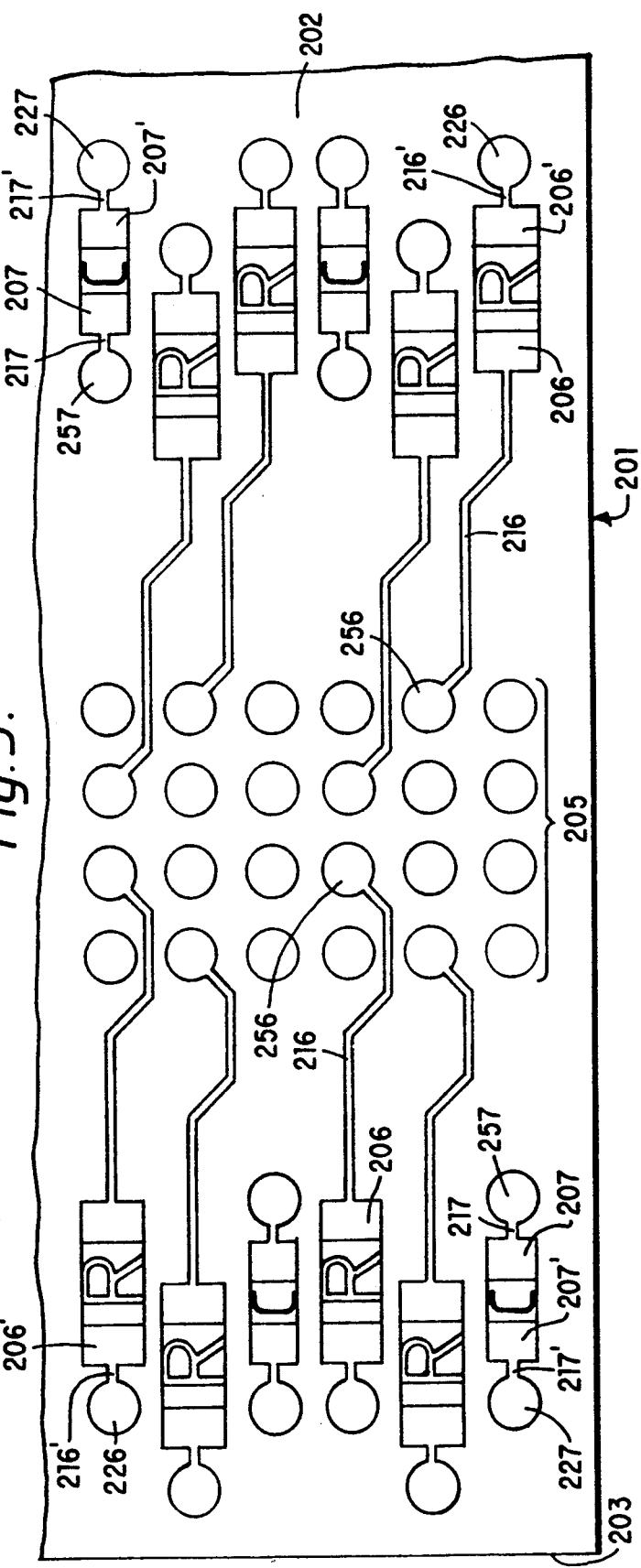

The invention is further illustrated by a description, by way of example, of three preferred terminating arrangements of backplanes of the kind described with reference to the accompany drawings, in which:

FIG. 1 is a fragmental diagrammatic plan view of the first preferred terminating arrangement on one face and at one of two ends of a backplane, and FIGS. 2 and 3, respectively, are similar views of the second and third preferred terminating arrangements of a backplane.

Referring to the drawings, in the first preferred backplane terminating arrangement shown in FIG. 1, at each end of the backplane 1 discrete resistors R and discrete capacitors C are mounted in two columns on each face of the electrically insulating board 2 of the backplane in a marginal portion of the board between the end edge 3 of the board and the nearest group 5 of four columns of plated through holes, a fragmental portion of one face of the board at one end of the backplane being shown. Between the two columns of discrete resistors R and discrete capacitors C is a single column 4 of plated through holes, each of the plated through holes of this column being electrically connected in series to the correspondingly positioned plated through hole in one column of the nearest group 5 of plated through holes by an elongate track of electrically conductive metal encapsulated in the electrically insulating material of the board 2. One terminal 6 of each resistor R in the right hand column of discrete resistors R and discrete capacitors C is electrically connected to a plated through hole 56 in the fourth column of the group 5 interconnected in a single signal line (not shown) of the backplane 1 by a track 16 of electrically conductive metal on the face of the board 2 and the other terminal 6' of each resistor R is electrically connected to a power bus 10 constituted by an elongate area of electrically conductive metal on the face of the board by a short track 16' of electrically conductive metal on the face of the board. One terminal 7 of each capacitor C in the right hand column of discrete resistors R and discrete capacitors C is electrically connected to a plated through hole 57 in the fourth column of the group 5 of plated through holes interconnected in a ground line (not shown) of the backplane 1 by a track 17 of electrically conductive metal on the face of the board 2 and the other terminal 7' of each capacitor in the right hand column is electrically connected to the power bus 10 by a short track 17' of electrically conductive metal on the face of the board. One terminal 8 of each resistor R in the left hand column of discrete resistors R and discrete capacitors C is electrically connected to a plated through hole 48 of the column 4 by a short track 18 of electrically conductive metal on the face of the board 2, the plated through hole 48 being electrically connected to a plated through hole 58 in the second column of the group 5 by a track 28 of electrically conductive metal encapsulated in the electrically insulating material of the board. The other terminal 8' of each resistor R in the left hand column is electrically connected to the power bus 10 by a short track 18' of electrically conductive metal on the face of the board. One terminal 9 of each capacitor C in the left hand column is electrically connected to a plated through hole 49 in the column 4 by a short track 19 of electrically conductive metal on the face of the board, the plated through hole 49 being electrically connected to a plated through hole 59 in the second column of the group 5 by a track 29 of electrically conductive metal encapsulated in the electrically insulating material of the board; the other terminal 9' of each capacitor in the left hand column is electrically connected to the power bus 10 by a short track 19' of electrically conductive metal on the face of the board.

On the opposite face of the board 2 at each end of the backplane 1, the discrete resistors R and discrete capacitors C of the two columns are electrically connected in the same manner to the plated through holes in the first and third columns of the group 5 of plated through holes.

As will be seen on referring to FIG. 1, each track electrically connected to a terminal of a resistor R or capacitor C in a column is of the same length and shape as those of the tracks electrically connected to the corresponding terminals of the other resistors or capacitors in the same column, but the tracks electrically connected to the terminals of resistors or capacitors in the right hand column are of a length and shape differing from those of the tracks electrically connected to corresponding terminals of resistors or capacitors in the left hand column. Although in this arrangement the cross-talk and degree of slew arising from tracks of lengths and shapes differing from one another is reduced as compared with terminating arrangements of backplanes of the kind described hitherto proposed and used, where the bit rate is expected to be high, the second backplane terminating arrangement shown in FIG. 2 is preferred.

In the second preferred backplane terminating arrangement shown in FIG. 2, at each end of and on each face of the board 102 of the backplane 101, one column of mutually spaced discrete resistors R and discrete capacitors C and a power bus 110 constituted by an elongate area of metal on the face of the board are positioned in a marginal portion of the board between the end edge 103 of the board and the nearest group 105 of four columns of plated through holes and a second column of mutually spaced discrete resistors R and discrete capacitors C and a second power bus 120 constituted by an elongate area of metal on the face of the board are positioned between the nearest group 105 of plated through holes and the adjacent group (not shown) of plated through holes. As will be seen, each column of resistors R and capacitors C is spaced a like distance from the group 105 of plated through holes and a like distance from its associated power bus 110 or 120. On the face of the board shown in FIG. 2, one terminal 106 of each resistor R of the right hand column of discrete resistors R and discrete capacitors C is electrically connected to a plated through hole 156 in the third column of the group 105 interconnected in a signal line by a track 116 of electrically conductive metal on the face of the board and the other terminal 106' of each resistor of this column is electrically connected to the power bus 120 by a short track 116 of electrically conductive metal on the face of the board. One terminal 107 of each capacitor C of the right hand column of discrete resistors R and discrete capacitors C is electrically connected to a plated through hole 157 in the third column of the group 105 interconnected in a ground line by a track 117 of electrically conductive metal on the face of the board and the other terminal 107' of each capacitor in the right hand column is electrically connected to the power bus 120 by a short track 117' of electrically conductive metal on the face of the board. One terminal 108 of each resistor R of the left hand column of discrete resistors R and discrete capacitors C is electrically connected to a plated through hole 158 in the second column of the group 105 interconnected in a signal line by a track 118 of electrically conductive metal on the face of the board and the other terminal 108' of each resistor of the left hand column is electrically connected to the power bus 110 by a short track 118' of electrically conductive metal on the face of the board. One terminal 109 of each capacitor C of the left hand column is electrically connected to a plated through hole 159 in the second column of the group 105 interconnected in a ground line by a track 119 of electrically conductive metal on the face of the board and the other other terminal 109' of each capacitor of the left hand column is electrically connected to the power bus 110 by a short track 119' of electrically conductive metal on the face of the board.

The discrete resistors R and discrete capacitors C in the two columns on the opposite face of the board 102 at this end of the backplane 101 will be electrically connected between plated through holes in the first and fourth columns of the group 105 and their associated power buses. The terminating arrangement at the opposite end of the backplane 101 will be identical to that described with reference to FIG. 2. As will be seen, in the second preferred backplane terminating arrangement the tracks electrically connected to corresponding terminals of the resistors R and capacitors C of both columns are of substantially the same length and shape as one another, thereby substantially eliminating any risk of slew.

Where it is desired to reduce the number of tracks of electrically conductive metal on each face of the board at each end of a backplane of the kind described, the third preferred backplane terminating arrangement shown in FIG. 3 can be used. In the third preferred backplane terminating arrangement, at each end of and on each face of the board 202 of the backplane 201, one column of mutually spaced discrete resistors R and discrete capacitors C is positioned in a marginal portion of the board between the end edge 203 of the board and the nearest group 205 of plated through holes and a second column of mutually spaced discrete resistors R and capacitors C is positioned between the group 205 of plated through holes and the adjacent group (not shown) of plated through holes, of each column of resistors and capacitors being spaced a like distance from the group 205 of plated through holes. One terminal 206 of each resistor R of each column is electrically connected to a plated through hole 256 of the group 205 interconnected in a signal line by a track 216 of electrically conductive metal on the face of the board and the other terminal 206' of each resistor R of each column is electrically connected by a short track 216' of electrically conductive metal on the face of the board to a plated through hole 226 in electrical contact with a continuous layer of electrically conductive metal encapsulated in the electrically insulating material of the board 202 and constituting a power plane (not shown). One terminal 207 of each capacitor C of each column is electrically connected to a plated through hole 257 interconnected in a ground line by a track 217 of electrically conductive metal on the face of the board and the other terminal 207' of each capacitor C of each column is electrically connected by a short track 217' of electrically conductive metal on the face of the board to a plated through hole 227 in electrical contact with said power plane. In the third preferred backplane terminating arrangement, risk of cross-talk and slew is negligible.

What I claim as my invention is:

1. A backplane of the kind comprising a substantially rigid board of electrically insulating material having extending through the board a multiplicity of plated through holes arranged in a plurality of discrete groups of plated through holes mutually spaced transversely of the board, the plated through holes of each group being arranged in a pattern of columns and rows of mutually spaced holes, each of a major proportion of the plated through holes of each group being electrically connected in series to the correspondingly positioned plated through hole in each of the other groups by an elongate track of electrically conductive metal or metal alloy encapsulated in the electrically insulating material of the rigid board to form a signal line, the tracks electrically connected to the plated through holes of corresponding columns of the groups lying in common planes which are substantially parallel to and mutually spaced from one another and being electrically insulated from one another by the electrically insulating material of the board, and each of the remaining minor proportion of the plated through holes of each group being electrically connected to a substantially continuous layer of electrically conductive metal or metal alloy which is encapsulated in the electrically insulating material of the board and which constitutes a ground plane, to form a ground line;

wherein at each end of the backplane a power conductor is carried by the board; the signal lines are each electrically connected to said power conductor via a resistor mounted on a face of the board and separately formed with respect to the resistors electrically connected to the other signal lines; and the ground lines are each electrically connected to said power conductor via a capacitor mounted on said face of the board and separately formed with respect to the capacitors electrically connected to the other ground lines.

2. A backplane as claimed in claim 1, wherein at each end of the backplane the discrete resistors and capacitors are mounted o both faces of the board.

3. A backplane as claimed in claim 2, wherein the number of resistors and capacitors mounted on one face of the board is approximately the same as the number of resistors and capacitors mounted on the other face.

4. A backplane as claimed in claim 2, wherein, at each end of the backplane, the discrete resistors and capacitors are mounted on each face of the board in a marginal portion of the board between the end edge of the board and the nearest group of plated through holes in two columns of mutually spaced discrete resistors and capacitors.

5. A backplane as claimed in claim 4, wherein one terminal of each resistor is electrically connected to a plated through hole of said nearest group of holes interconnected in a signal line by a track of electrically conductive metal or metal alloy and the other terminal of each resistor is electrically connected to a power bus constituted by an area of electrically conductive metal or metal alloy on the face of the board by a track of electrically conductive metal or metal alloy on the face of the board, and one terminal of each capacitor is electrically connected to a plated through hole of said nearest group of holes interconnected in a ground line by a track of electrically conductive metal or metal alloy and the other terminal of each capacitor is electrically connected to said power bus by a track of electrically conductive metal or metal alloy on the face of the board.

6. A backplane as claimed in claim 5, wherein each track electrically connected to a terminal of a resistor and each track electrically connected to a terminal of a capacitor in one column are of the same length and shape of those of the tracks electrically connected to the corresponding terminals of the other resistors and capacitors in the same column, the tracks electrically connected to the terminals of resistors and capacitors in one column being of a length and shape differing from those of the tracks electrically connected to corresponding terminals of resistors and capacitors in the other column.

7. A backplane as claimed in claim 2, wherein, at each end of and on each face of the board, one column of mutually spaced discrete resistors and capacitors and a power bus constituted by an area of metal or metal alloy on the face of the board are positioned in a marginal portion of the board between the end edge of the board and the nearest group of plated through holes and a second column of mutually spaced discrete resistors and capacitors and a second power bus constituted by an area of metal or metal alloy on the face of the board are positioned between said nearest group of plated through holes and the adjacent group of plated through holes, each column of resistors and capacitors being spaced a like distance form said nearest group of plated through holes and a like distance from its associated power bus, and wherein one terminal of each resistor of the first column is electrically connected to a plated through hole of said nearest group of holes interconnected in a signal line by a track of electrically conductive metal or metal alloy on the face of the board and the other terminal of each resistor of said first column is electrically connected to said power bus associated with said first column by a track of electrically conductive metal or metal alloy on the face of the board, and one terminal of each capacitor of said first column is electrically connected to a plated through hole of said nearest group of holes interconnected in a ground line by a track of electrically conductive metal or metal alloy on the face of the board and the other terminal of each capacitor of said first column is electrically connected to said power bus associated with said first column by a track of electrically conductive metal or metal alloy on the face of the board, and one terminal of each resistor of the second column is electrically connected to a plated through hole of said nearest group of holes interconnected in a signal line by a track of electrically conductive metal or metal alloy on the face of the board and the other terminal of each resistor of said second column is electrically connected to said power bus associated with said second column by a track of electrically conductive metal or metal alloy on the face of the board and one terminal of each capacitor of said second column is electrically connected to a plated through hole of said nearest group of holes interconnected in a ground line by a track of electrically conductive metal or metal alloy on the face of the board and the other terminal of each capacitor of said second column is electrically connected to said power bus associated with said second column by a track of electrically conductive metal or metal alloy on the face of the board.

8. A backplane as claimed in claim 7, wherein the tracks electrically connected to corresponding terminals of the resistors and capacitors of both columns are of substantially the same length and shape as one another.

9. A backplane as claimed in claim 2, wherein, at each end of and on each face of the board, one column of mutually spaced discrete resistors and capacitors is positioned in a marginal portion of the board between the end edge of the board and the nearest group of plated through holes and a second column of mutually spaced discrete resistors and capacitors is positioned between said nearest group of plated through holes and the adjacent group of plated through holes, each column of resistors and capacitors being spaced a like distance from said nearest group of plated through holes, and wherein one terminal of each resistor of each column is electrically connected to a plated through hole of said nearest group of holes interconnected in a signal line by a track of electrically conductive metal or metal alloy on the face of the board and the other terminal of each resistor of each column is electrically connected to a plated through hole in electrical contact with a substantially continuous layer of electrically conductive metal or metal alloy encapsulated in the electrically insulating material of the board and constituting a power plane, and one terminal of each capacitor of each column is electrically connected to a plated through hole interconnected in a ground line by a track of electrically conductive metal or metal alloy on the face of the board and the other terminal of each capacitor of each column is electrically connected to a plated through hole in electrical contact with said power plane by a track of electrically conductive metal or metal alloy on the face of the board.

10. A backplane as claimed in claim 1, wherein each discrete resistor and each discrete capacitor includes at each of its ends a lead.

11. A backplane as claimed in claim 1, wherein the power conductor is a power bus of electrically conductive metal or metal alloy on said face of the board.

12. A backplane as claimed in claim 1, wherein the power conductor is a power plane constituted by a substantially continuous layer of electrically conductive metal or metal alloy encapsulated in the electrically insulating material of the board.

* * * * *